United States Patent
Park (10) Patent No.: US 6,744,217 B2
(45) Date of Patent: Jun. 1, 2004

(54) ORGANIC ELECTRO LUMINESCENCE DEVICE

(75) Inventor: Jae Yong Park, Gyeonggi-Do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/329,484

(22) Filed: Dec. 27, 2002

(65) Prior Publication Data

US 2003/0122498 A1 Jul. 3, 2003

(30) Foreign Application Priority Data

Dec. 31, 2001 (KR) .......................................... 2001-89298

(51) Int. Cl.⁷ ................................................. G09G 3/10
(52) U.S. Cl. ................................. 315/169.3; 315/169.1; 257/753; 257/762; 345/76
(58) Field of Search ........................... 315/169.3, 169.1, 315/169.2; 257/753, 754, 762, 763; 345/76, 82, 84; 349/43–46

(56) References Cited

U.S. PATENT DOCUMENTS

| | | | |
|---|---|---|---|
| 5,472,889 A | * 12/1995 | Kim et al. ..................... 438/28 |
| 6,111,619 A | * 8/2000 | He et al. ....................... 349/43 |
| 6,448,578 B1 | * 9/2002 | Shimada et al. ............... 257/59 |
| 6,501,227 B1 | * 12/2002 | Koyama ..................... 315/169.3 |

\* cited by examiner

Primary Examiner—Haissa Philogene
(74) Attorney, Agent, or Firm—Morgan, Lewis & Bockius LLP (57) ABSTRACT

An organic electro luminescence device includes a gate line for supplying a gate signal, a data line for supplying image information that crosses the gate line, a pixel area adjacent to where the gate line and the data line cross over each other, an organic emitting layer formed in the pixel area, a switching unit for switching image information supplied from the data line in response to the gate signal supplied from the gate line, a driving unit for applying an electric field across the organic emitting layer according to the image information supplied through the switching unit and a power line for providing the driving unit with a source voltage, wherein at least one of the gate line, data line and power line is a three-layer structure having an intermediate layer made of copper.

23 Claims, 7 Drawing Sheets

ORGANIC ELECTRO LUMINESCENCE DEVICE

The present invention claims the benefit of the Korean Patent Application No. 2001-89298 filed in Korea on Dec. 31, 2001, which is hereby incorporated by reference in its entirety.

BACKGROUND OF THE INVENTION

1. Field of the Invention

The present invention relates to an organic electro luminescence device, and more particularly, an organic electro luminescence device with low-resistance wiring.

2. Description of the Background Art

An organic electro luminescence display using an electroluminescence (EL) device is seen as the next generation display device after the cathode ray tube (CRT) and a liquid crystal display (LCD). Its applicability is wide spread and an EL device is used as a display in devices such as portable terminals, car navigation systems (CNS), game machines, notebook computers, and wall-type televisions. Generally, an organic electro luminescence display includes a matrix of electro luminescence devices each including an organic emitting layer positioned between a positive electrode and a negative electrode. Light is emitted from the organic emitting layer when a voltage is applied across the positive electrode and the negative electrode.

More specifically, the positive electrode is formed by sputtering indium-tin-oxide (ITO) on a glass substrate having switching and drive circuits and then patterning the ITO such that the electrode is connected to a drive circuit. An organic emitting layer including a hole transport layer, an emitting layer, and an electron transport layer are then formed on the ITO film. A negative electrode is then formed on the organic emitting layer. The negative electrode is a metal having low work function so as to readily supply electrons to the organic emitting layer. The ITO of the positive electrode has a high electrical conductivity so that holes can be readily supplied to the organic emitting layer. Further, the ITO has high light transmittance so that light emitted from the organic emitting layer can be transmitted through the positive electrode. Thus, when positive and negative voltages are applied to the positive electrode and to the negative electrode, respectively, the holes injected from the positive electrode and the electrons injected from the negative electrode cause the organic emitting layer to emit light.

In an organic electro luminescence display, unit pixels each containing an organic emitting layer are disposed in a matrix form. The organic emitting layers of the unit pixels are selectively driven through thin film transistors disposed in each of the respective unit pixels to display an image. The organic electro luminescence display described above will be described in more detail with reference to accompanying FIG. 1 showing an equivalent circuit for configuring and operating the thin film transistors in accordance with a voltage driving method.

Figure 1:
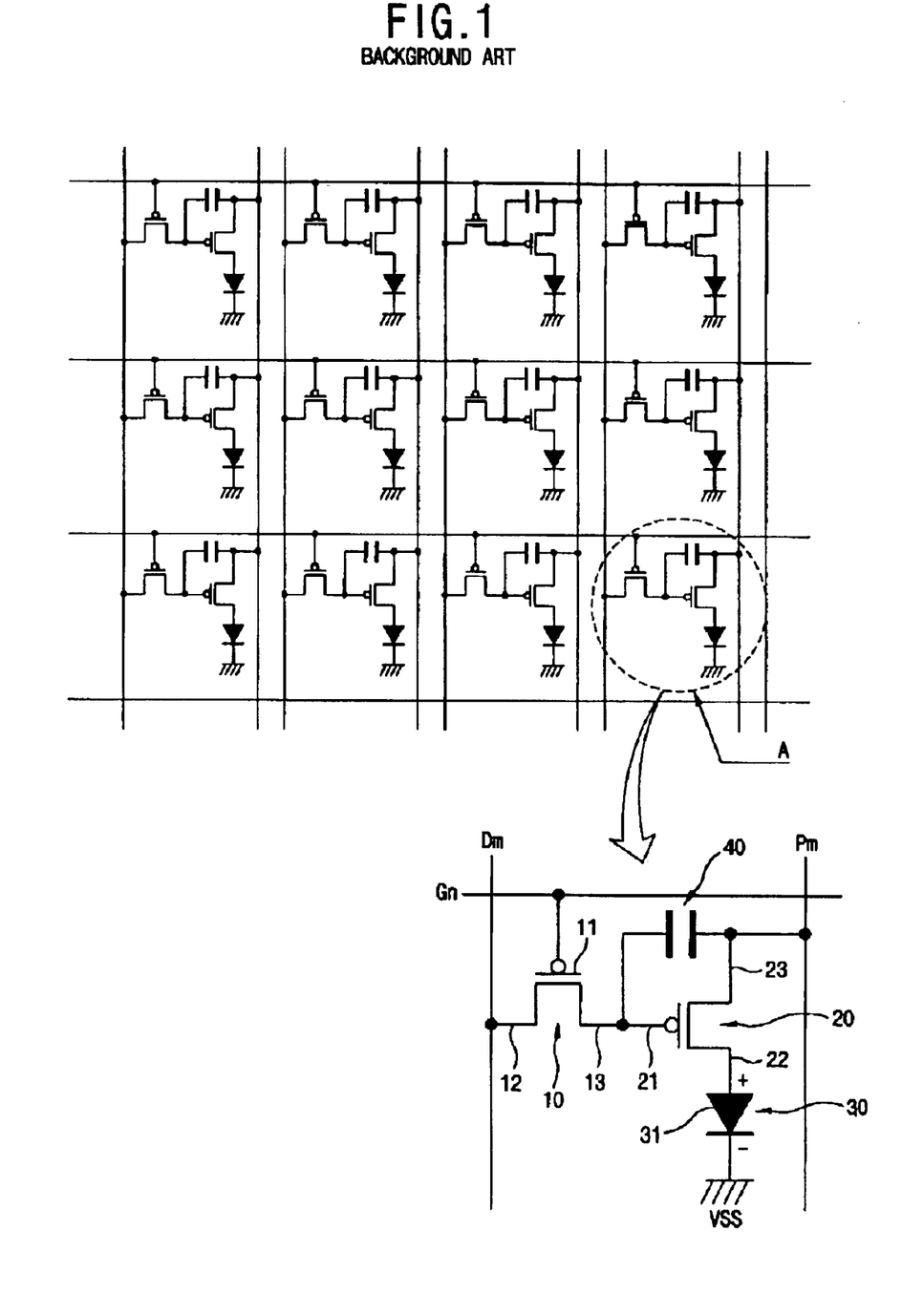
FIG. 1 depicts an equivalent circuit of an organic electro luminescence display device in accordance with a voltage driving method.

As shown in FIG. 1, each unit pixel includes a first thin film transistor 10 and a second thin film transistors 20, and an organic luminescence device 30. The unit pixel is defined by a gate line Gn for supplying a gate signal to the gate of the first thin film transistor 10 in a row direction, a data line Dm for supplying a data signal to the source of the first thin film transistor 10 in a column direction, a power line Pm for supplying electric power to the source of the second thin film transistor 20 in a column direction and a gate line of another pixel area in a row direction. The first thin film transistor 10 includes a gate electrode 11 connected to the gate line Gn to be supplied with the gate signal, a source electrode 12 connected to the data line Dm to be supplied with the data signal, and a drain electrode 13 connected to a gate electrode 21 of the second thin film transistor 20. The second thin film transistor 20 includes the gate electrode 21 connected to the drain electrode 13 of the first thin film transistor 10, a drain electrode 22 connected to a pixel electrode, and a source electrode 23 connected to the power line Pm. The organic luminescence device 30 includes an organic emitting layer 31 positioned between a cathode electrode (not shown) and an anode electrode (not shown), wherein the organic emitting layer 31 includes a hole transport layer (not shown), an emitting layer (not shown), and an electron transport layer (not shown). In addition, a capacitor 40 is included in which one electrode is connected to the power line Pm and the other electrode is connected both to the drain electrode 13 of the first thin film transistor 10 and to the gate electrode 21 of the second thin film transistor 20.

Hereinafter, the operation of the equivalent circuit for the unit pixel of the organic electro luminescence display device shown in FIG. 1 will be described in detail as follows. When the gate signal is applied to the gate electrode 12 from the gate line Gn, the first thin film transistor 10 is turned on, and therefore, the data signal supplied from the data line Dm is supplied to the gate electrode 21 of the second thin film transistor 20 through the source electrode 12 and the drain electrode 13 of the first thin film transistor 10. Thus, the potential of the gate electrode 21 becomes the same as that of the data line Dm.

The degree of turn on for the second thin film transistor 20 is decided by the potential supplied to the gate electrode 21, and therefore, electric current corresponding to the potential supplied to the gate electrode 21 is supplied to the organic luminescence device 30 from the power line Pm. The organic luminescence device 30 emits light according to the amount of electric current supplied. Thus, the brightness of the light emitted from the organic luminescence device 30 is determined by the value or voltage of the data signal, which is applied through the data line Dm.

Generally, in a display device having a matrix form, a gate signal is supplied to the first gate line and then to the rest of the gate lines sequentially such that an image is displayed on the screen after the sequence is completed across the display. The capacitor 40 in a unit pixel stays charged to the potential of the data signal to maintain the luminescence of the organic luminescence device 30 in the unit pixel until another data signal is supplied corresponding to another gate signal from the gate line Gn of the unit pixel. Thus, the amount of light from each unit pixel can be changed each time a gate signal is sequentially applied across the display to all of the gate lines Gn.

Figure 2:
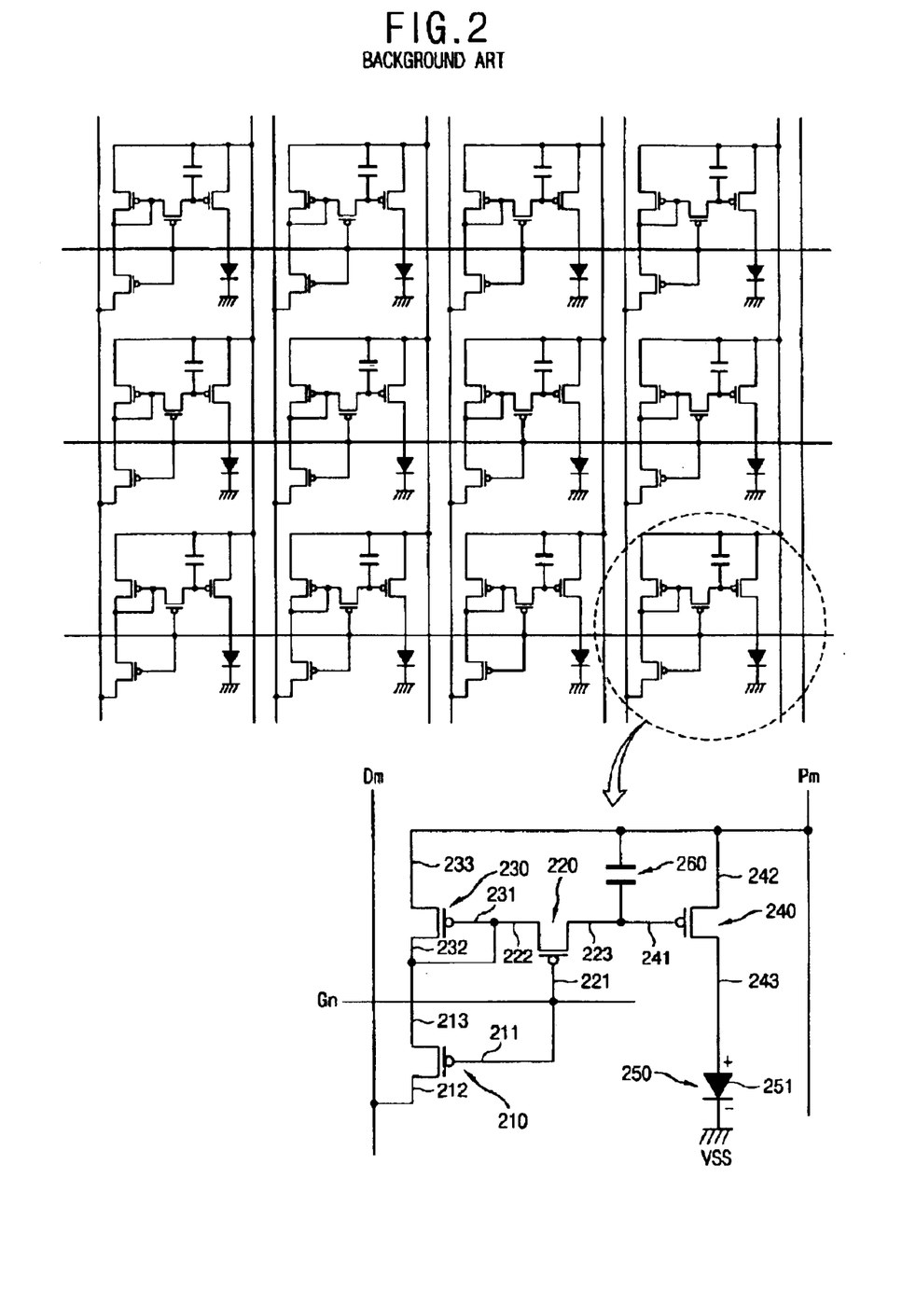
FIG. 2 depicts an equivalent circuit of an organic electro luminescence display device in accordance with a current driving method.

FIG. 2 depicts an equivalent circuit diagram of an organic electro luminescence device for configuring and operating the thin film transistors according to a current driving method. As shown in FIG. 2, a unit pixel includes a first thin film transistor 210 and a second thin film transistors 220 for switching, a third thin film transistor 230 and a fourth thin film transistor 240 for driving, and an organic luminescence device 250. The area of the unit pixel is divided by gate line Gn for supplying a gate signal to the unit pixel, and is in between the data line Dm for supplying the data signal to the unit pixel and the power line Pm for supplying electric power to the source of the fourth transistor 240 of the unit pixel.

When a gate signal is supplied from the gate line Gn, the first switching thin film transistor 210 is turned on, and therefore, the data signal supplied from the data line Dm is supplied to the source electrode 232 and to the gate electrode 231 of the third thin film transistor 230 through the source electrode 212 and drain electrode 213 of the first thin film transistor 210. At the same time, the gate signal is also applied to the gate electrode 221 of the second thin film transistor 220 from the gate scan line Gn such that the second thin film transistor 220 is also turned on. The amount of current flowing through the drain electrode 233 and the source electrode 232 of the third thin film transistor 230 from the power line Pm is determined by the data signal supplied to the source electrode 232 and to the gate electrode 231 of the third thin film transistor 230. In addition, the same amount of current is supplied to the organic luminescence device 250 through the source electrode 242 and the drain electrode 243 of the fourth thin film transistor 240 from the power line Pm. Therefore, the third thin film transistor 230 and fourth thin film transistor 240 operate as current mirrors in driving the organic luminescence device 250. The brightness or intensity of the light emitted from the organic luminescence device 250 is proportionate to the amount of current supplied to the organic luminescence device, and the amount of current supplied to the organic luminescence device 250 is determined by the value or voltage of the data signal supplied from the data line Dm. Thus, the brightness or intensity of the light is determined by the data signal supplied from the data line Dm during the application of a gate signal from the gate line Gn.

However, in the organic electro luminescence displays as described above, the length of the gate line, data line, and the power line plays a role in displaying an image uniformly in terms of the images brightness arcross the display. The resistance along a gate line, data line and power line has more effect on the image uniformity in larger displays, since these lines are longer in larger displays. For example, the difference in brightness in a large organic electro luminescence display increases along a direction parallel with the gate line in the case of each pixel having 2-TFTs to drive an organic electro luminescence device with voltage. In another example, the difference in brightness in a large organic electro luminescence display increases in a direction parallel with the data line in the case of each pixel having 4-TFTs to drive an organic electro luminescence device with current.

Therefore, copper (Cu), that is, metal of low resistance is used as the wires in order to minimize the resistance of the gate line, data line, and power line. However, copper has low adhesion to insulating layers. Further, copper tends to diffuse into insulating layers, which significantly degrades the dielectric properties of the insulating layers.

SUMMARY OF THE INVENTION

Accordingly, the present invention is directed to an organic electro luminescence device that substantially obviates one or more of the problems due to limitations and disadvantages of the related art.

An object of the present invention is to provide an organic electro luminescence device which is able to improve image quality of a display by minimizing the resistance of the gate line, and/or both the data line and the power line without degrading the dielectric properties of the insulating layers or the adhesion of the lines to the insulating layers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided an organic electro luminescence device including a gate line for supplying a gate signal, a data line for supplying image information that crosses the gate line, a pixel area adjacent to where the gate line and the data line cross each other, an organic emitting layer formed in the pixel area, a switching unit for switching image information supplied from the data line in response to the gate signal supplied from the gate line, a driving unit for applying an electric field across the organic emitting layer according to the image information supplied through the switching unit and a power line for providing the driving unit with a source voltage, wherein at least one of the gate line, data line and power line is a three-layer structure having an intermediate layer made of copper.

In another aspect, the an organic electro luminescence device includes a gate line for supplying a gate signal, a data line for supplying image information that crosses the gate line, a pixel area adjacent to where the gate line and the data line cross each other, an organic emitting layer formed in the pixel area, a switching unit for switching image information supplied from the data line in response to a gate signal supplied from the gate line, a driving unit for applying electric field across the organic emitting layer according to the image information applied through the switching unit and a power line, which is a first three-layer structure including an intermediate layer made of copper, for providing the driving unit with source voltage.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in FIG. 3, FIG. 4, FIG. 5, FIG. 6 and FIGS. 7a–7l.

Figure 3:
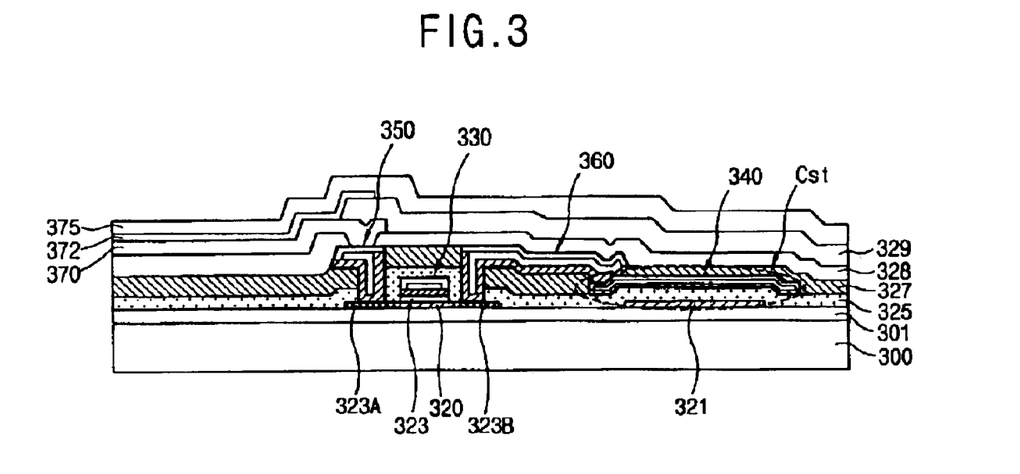
FIG. 3 is a cross-sectional view showing an organic electro luminescence device in accordance with an embodiment of the present invention.

FIG. 3 is showing a cross section of an organic electro luminescence device according to an embodiment of the present invention. As shown in FIG. 3, the organic electro luminescence device of this example includes an active layer 320 of a thin film transistor and a lower storage electrode 321 of a capacitor Cst formed on a barrier layer 301, which is formed on an entire surface of a transparent substrate 300. A gate insulating layer 323 is formed on the active layer 320. A gate electrode 330, which is made of a three-layers including a Cu layer as an intermediate layer, is formed on the gate insulating layer 323. A first interlayer insulator 325 is formed across the barrier layer 301 and on the gate electrode 330 and the lower storage electrode 321. A power line 340, which is made of a three-layers including a Cu layer as an intermediate layer, is formed overlapping the lower storage electrode 321 with the first interlayer insulator 325 positioned between the power line 340 and the lower storage electrode 321. A second interlayer insulator 327 is formed on the power line 340 and across the first interlayer insulator 325. A drain electrode 350 of the thin film transistor is contacted to a drain area 323A, which is formed on an edge of the active layer 320 and includes impurity ions injected therein. A source electrode 360 of the thin film transistor is contacted to the power line 340 and to the source area 323B, which is formed on the other edge of the active layer 320. A passivation layer 328 is formed on the drain electrode 350 and the source electrode 360 as well as across the second interlayer insulator 327. An anode electrode 370 is formed on the passivation layer 328 in contact with the drain electrode 350. A third interlayer insulator 329 is formed on a portion of the anode electrode 370 and across the passivation layer 328. An organic emitting layer 372 is formed on the anode electrode 370. An cathode electrode 375 is formed on the organic emitting layer 372 and across the third interlayer insulator 329.

The barrier layer 301 blocks impurities within the substrate 300 from being discharged into the active layer 320 of the thin film transistor. The barrier layer 301, the gate insulating layer 323, the first interlayer insulator 325, the second interlayer insulator 327, and the third interlayer insulator 329 can be made of a field oxide, such as $SiO_x$ having a low dielectric constant that does not change due to high temperatures. The power line 340, the gate electrode 330, the source electrode 360, and the drain electrode 350 are constructed as three-layer structures having Cu layer as an intermediate layer such that the Cu layer is encapsulated by the other two layers.

Figure 4:
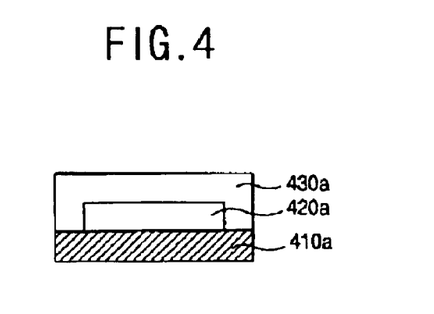
FIG. 4, FIG. 5 and FIG. 6 are views depicting cross sections of a three-layer wiring structure in accordance with an embodiment of the present invention.

As shown in FIG. 4, a first layer 410a for improving adhesiveness with insulating layers can be formed on the lower parts of the power line, gate electrode, source electrode, and drain electrodes. An intermediate layer 420a made of Cu is formed on the first layer 410a. A second layer 430a is formed on and about the sides of the Cu intermediate layer to prevent Cu from being diffused into surrounding insulating layers.

The first layer 410a can be made of one of titanium (Ti), titanium nitride layer (TiN), tungsten (W), molybdenum (Mo) and chrome (Cr), for example. The second layer 430a can be made of one of titanium (Ti), titanium nitride layer (TiN), tungsten (W), molybdenum (Mo), and chrome (Cr), for example. The first layer 410a and the second layer 430a can be made of the same or different metal materials from each other.

The first layer 410a improves the adhesiveness with a lower insulator layer, and the second layer 430a together with the first layer 410a encapsulates the intermediate layer 420a such that the copper of the intermediate layer 420a does not diffuse into an insulating layer. Such a three-layer wiring structure has low resistance, good adhesion to surrounding insulating layers and prevents the insulating characteristics of surrounding insulating layers from degrading. Although it is not shown in FIG. 3, this three-layer wiring structure can be used simultaneously in both the gate line and the data line, as well as in the gate electrode, the source electrode, drain electrode, the power line and any combination thereof.

Figure 5:
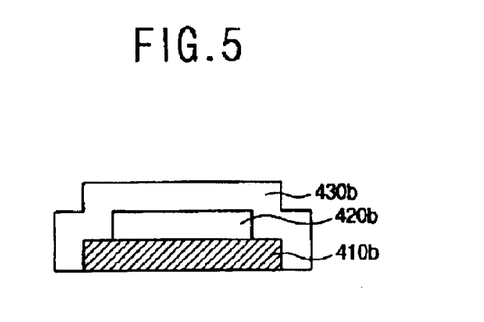
Figure 6:
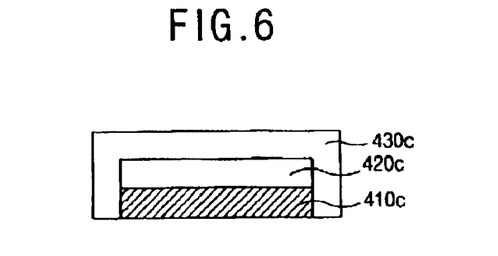

The three-layer wiring structure of the present invention can be any of configuration that entirely encapsulates an intermediate copper layer. For example, as shown in FIG. 5, in a wiring structure in which the intermediate layer 420b is on the first layer 410b, a second layer 430b can be on top of both the first and intermediate layers, as well as at the sides of both the first and intermediate layers. In other words, the width of the intermediate layer, which is formed on upper part of the first layer, is narrower than the width of the first layer with the second layer on top of and about each of the first and intermediate layers, as shown in FIG. 5. In another example, as shown in FIG. 6, the first layer 410c and the intermediate layer 420c can be formed to have the same width with the second layer 430c only on top surface of the intermediate layer and about the sides of both the first and intermediate wiring layers.

A fabrication method of the organic luminescence device according to the present invention will be described with reference to FIG. 7a through FIG. 7l.

Figure 7A:
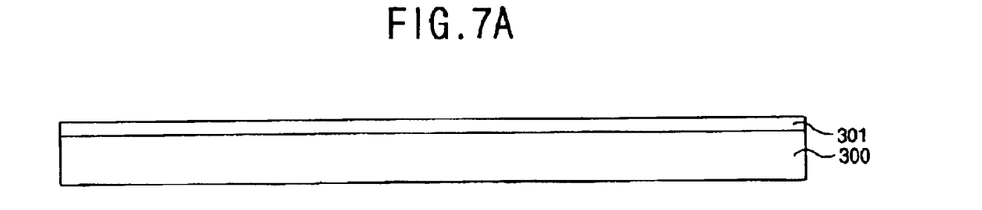
FIG. 7a through FIG. 7l are cross-sectional views showing a process for fabricating an organic luminescence device in accordance with an embodiment of the present invention.

As shown in FIG. 7a, silicon oxide layer is deposited on a transparent substrate 300 having an insulating property, such as glass, to form a barrier layer 301.

Figure 7B:
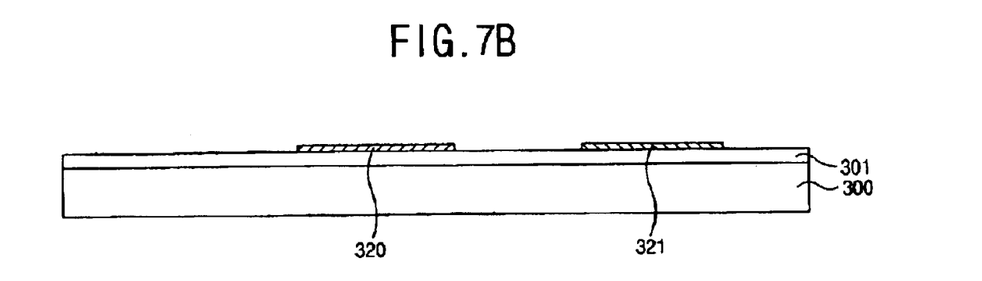

As shown in FIG. 7b, a semiconductor layer is patterned on the barrier layer 301 to form an active layer 320 of the thin film transistor and the lower electrode 321 of the capacitor Cst at the same time. The semiconductor layer is formed of poly silicon by depositing amorphous silicon and then heating the amorphous silicon with a laser, for example.

Figure 7C:
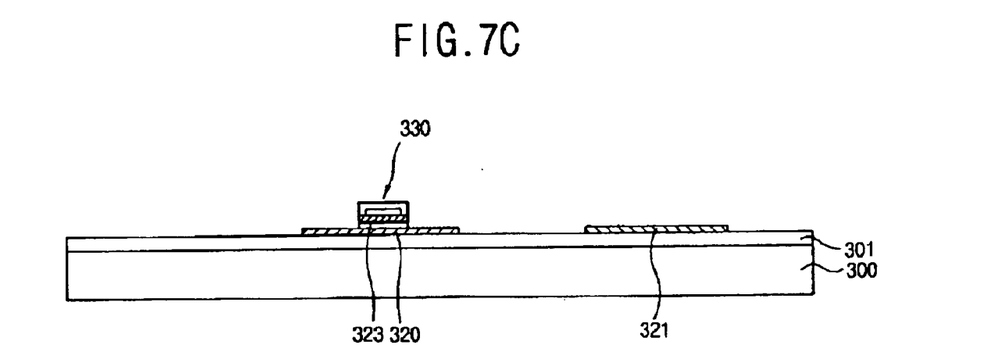

As shown in FIG. 7c, a gate insulating layer 323 is formed on the active layer 320 on a center portion of the active layer 320. A first wiring layer and an intermediate wiring layer are successively formed on the gate insulating layer 323. A second wiring layer is formed to encapsulate the intermediate wiring layer, and thereby, the gate electrode 330 of the thin film transistor is formed. Copper is used as the intermediate wiring layer while one of titanium (Ti), titanium nitration layer (TiN), tungsten (W), molybdenum (Mo) and chrome (Cr) is used as the first and second wiring layer, for example. In the alternative, each of the first wiring layer and the second wiring layers can have a different one of titanium (Ti), titanium nitration layer (TiN), tungsten (W), molybdenum (Mo) and chrome (Cr), for example.

Figure 7D:
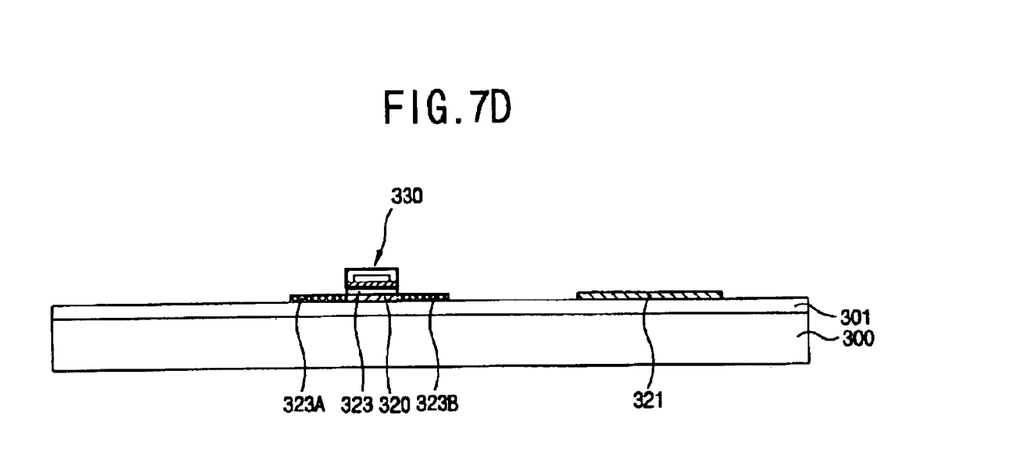

As shown in FIG. 7d, an impurity ion such as boron (B) is injected into each side of the active layer 320 using the gate electrode 330 as a mask, thereby forming the source area 323B and the drain area 323A. The impurity ions can be first injected at a low density using the mask, that is, the gate to form the source area and the drain area of low density. Then, a photoresist mask that determines distance from the gate for the low density source and drain areas to a high density area can be used with a secondary high density ion injection to thereby form high density source and drain areas. Thus, a thin film transistor having a lightly doped drain (LDD) structure can be formed if desired.

Figure 7E:
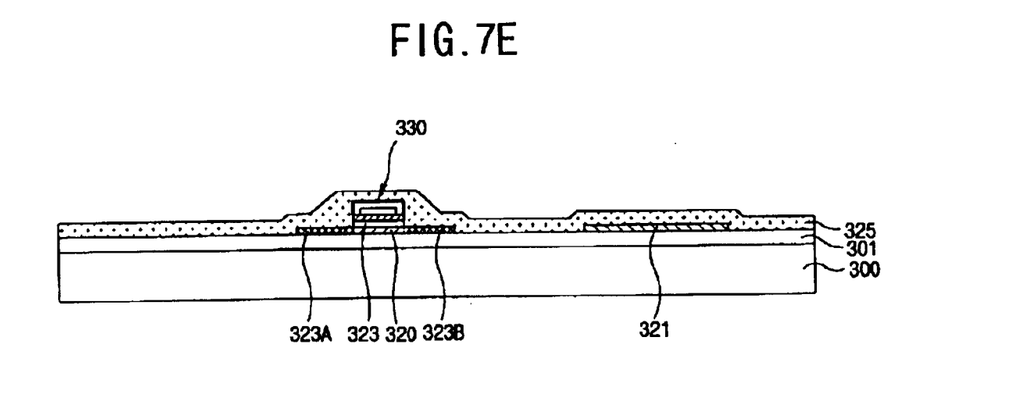

As shown in FIG. 7e, a first interlayer insulator 325 is formed on the gate electrode 330, source area 323B, the drain area 323A and the lower storage electrode 321 of the capacitor.

Figure 7F:
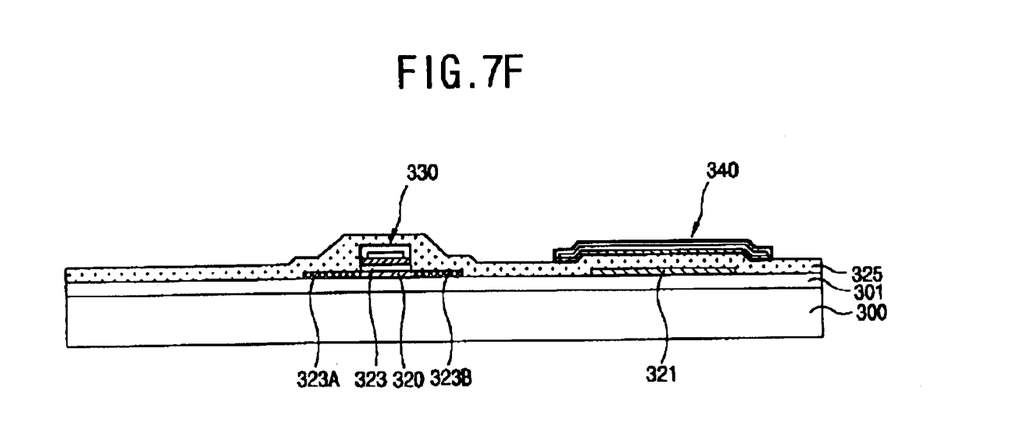

In addition, as shown in FIG. 7f, a power line 340 is laminated on the upper part of the first interlayer insulator 325 such that the power line 340 overlaps the lower storage electrode 321 of the capacitor with the first interlayer insulator 325 therebetween. The power line 340 is formed in a similar manner to that of the gate electrode 330 of the thin film transistor in that the power line 340 is formed of a three-layer wiring structure having a copper layer as the intermediate layer.

Figure 7G:
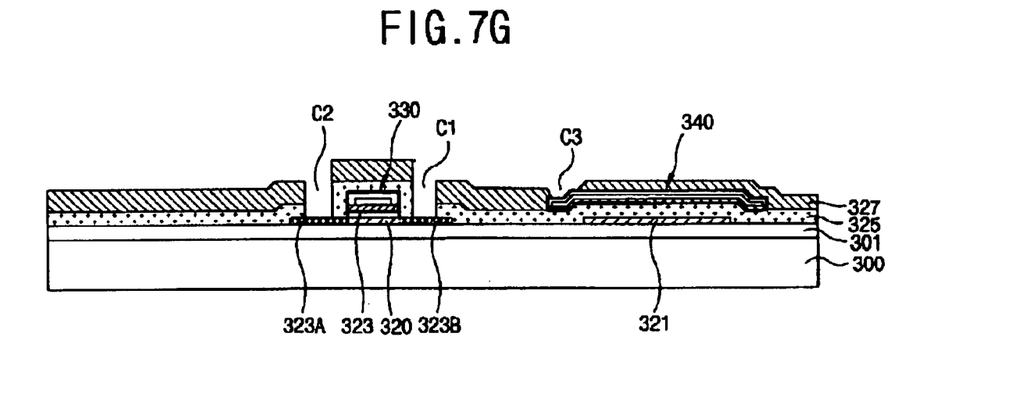
Figure 7H:
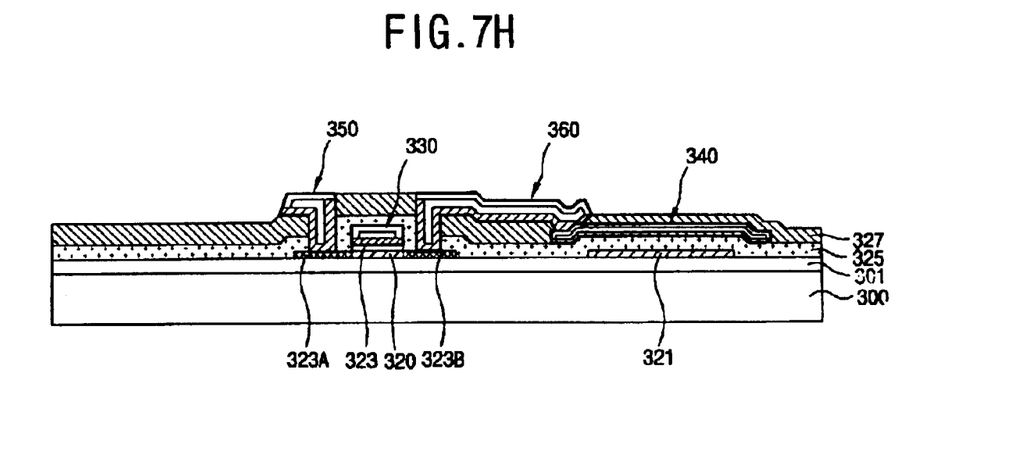

As shown in FIG. 7g, the second interlayer insulator 327 is formed on first interlayer insulator 325 and on the power line 340. Then, the second interlayer 327 and the first interlayer insulator 325 are etched selectively so that the source area 323B, the drain are 323A, and some of the power line 340 can are exposed to form a first contact hole C1, a second contact hole C2, and a third contact hole C3, respectively As shown in FIG. 7h, a drain electrode 350, which contacts to the drain area 323A through the second contact hole C2, has a predetermined cross sectional length on the second inter layer 327. A source electrode 360, which is apart from the drain electrode 350, extends from the first contact hole C1 to the third contact hole C3 such that the source area 323B is connected to the power line 340. In this example, the source electrode 360 and drain electrode 350 are formed in a manner similar to that of the gate electrode and the power line in that a three-layer wiring structure is used.

Figure 7I:
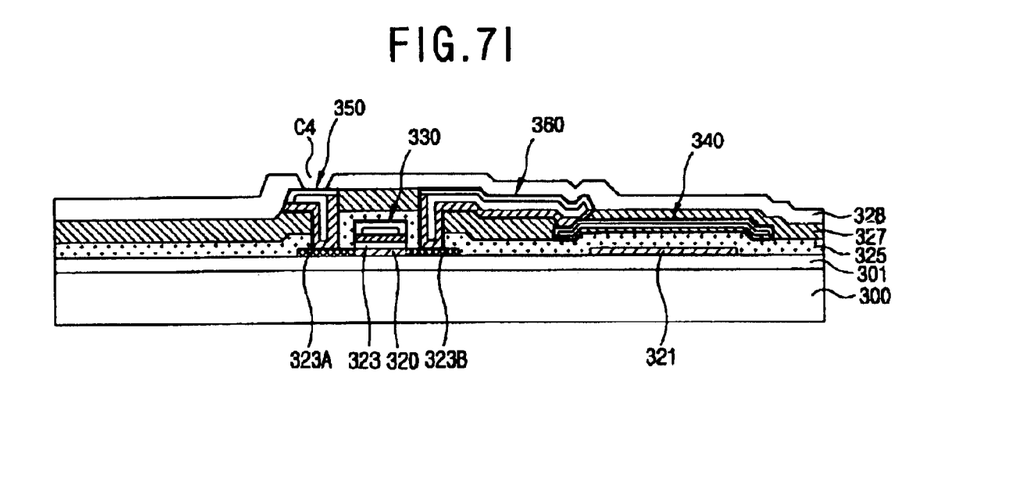

As shown in FIG. 7i, a passivation layer 328 is formed on the source electrode 360, the drain electrode 350 and the second interlayer insulator 327. Then, the passivation layer 328 is etched so that some of the drain electrode 350, which is contacted to the drain area 323A, is exposed to form a fourth contact hole C4.

Figure 7J:
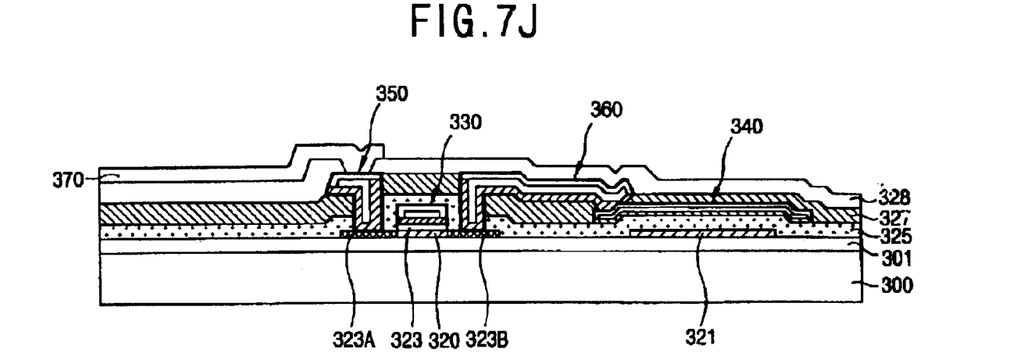

As shown in FIG. 7j, an anode electrode 370 is patterned such that the anode electrode 370 can be contacted to the drain area 323A through the fourth contact hole C4 and extends across the upper part of the passivation layer 328 towards the pixel area.

Figure 7K:
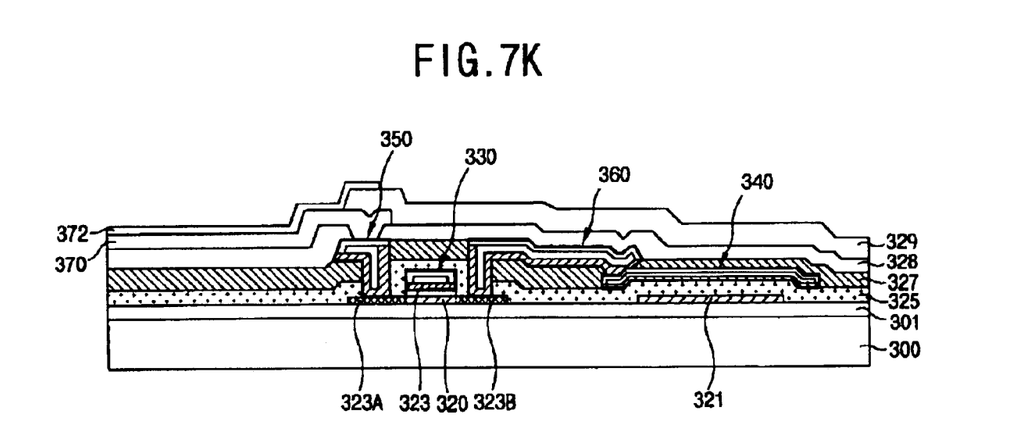

As shown in FIG. 7k, a third interlayer insulator 329 is formed on the upper part of the passivation layer 328 including the anode electrode 370 such that only an edge of the anode electrode 370 is not exposed. Then, the organic emitting layer 372 is patterned on the exposed part of the anode electrode 370 and on the upper part of the third interlayer insulator 329 located near the edge of the anode electrode 370. The organic emitting layer 372 can include a hole transport layer, an emitting layer, and a electron transport layer.

Figure 7L:
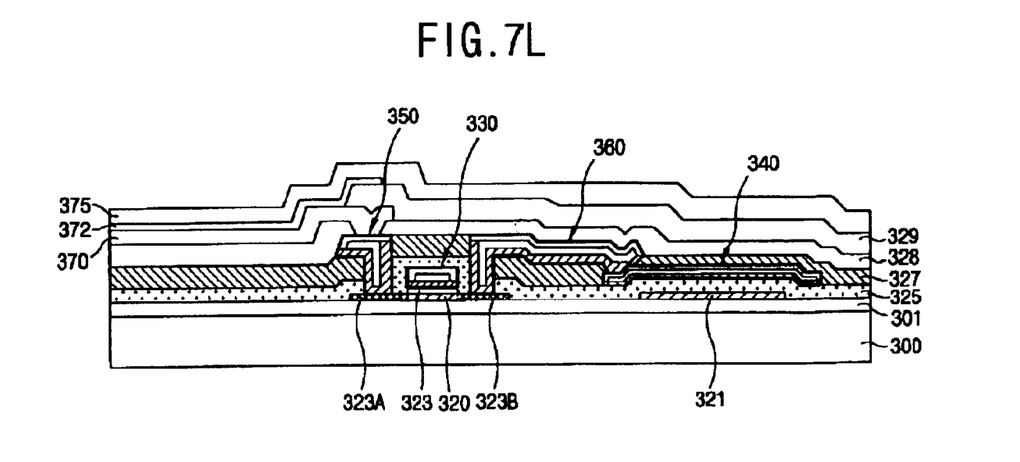

As shown in FIG. 7l, the cathode electrode 375 of the organic luminescence device is formed on the upper surface of the third interlayer insulator 329 and on the organic emitting layer 372.

In forming the source electrode, drain electrode, the gate electrode, and the power line, the wiring layers can be formed by separately patterning the respective wiring layers, or formed by patterning the first and intermediate wiring layers together, and then forming the second wiring layer that is subsequently patterned.

The organic electro luminescence device according to the present invention forms three-layer wiring structure using a copper layer as the intermediate layer, and thereby, the resistance of the gate line, the data line, and the power line can be minimized. In addition, the degradation of the dielectric properties of insulators due to copper diffusion into the insulators is prevented by the first and second wiring layers, which encapsulate the copper layer. In addition, the first and second wiring layers have good adhesion to adjacent insulating layers.

It will be apparent to those skilled in the art that various modifications and variations can be made in the organic electro luminescence device of the present invention without departing from the spirit or scope of the invention. Thus, it is intended that the present invention cover the modifications and variations of this invention provided they come within the scope of the appended claims and their equivalents.

What is claimed is:

1. An organic electro luminescence device comprising:
   a gate line for supplying a gate signal;
   a data line for supplying image information that crosses the gate line;
   a pixel area adjacent to where the gate line and the data line cross each other;
   an organic emitting layer formed in the pixel area;
   a switching unit for switching image information supplied from the data line in response to the gate signal supplied from the gate line;
   a driving unit for applying an electric field across the organic emitting layer according to the image information supplied through the switching unit; and
   a power line for providing the driving unit with a source voltage,
   wherein at least one of the gate line, data line and power line is a three-layer structure having an intermediate layer made of copper that is surrounded by the other two layers.

2. The device of claim 1, wherein the gate line is a first three-layer structure having an intermediate layer made of copper and the power line is a second three-layer structure having an intermediate layer made of copper.

3. The device of claim 1, wherein the gate line is a first three-layer structure having an intermediate layer made of copper and the data line is a second three-layer structure having an intermediate layer made of copper.

4. The device of claim 2, wherein the data line is a third three-layer structure having an intermediate layer made of copper.

5. The device of claim 1, 2, 3 or 4, wherein a first layer formed on a lower part of an intermediate layer is made of one of titanium, titanium nitride, tungsten, molybdenum and chrome.

6. The device of claim 1, 2, 3 or 4, wherein a second layer formed on an upper part of an intermediate layer is made of one of titanium, titanium nitride, tungsten, molybdenum and chrome.

7. The device of claim 1, wherein a second layer is formed on a top surface and side surfaces of the intermediate layer, and a first layer formed on lower surface of the intermediate layer connects to the second layer formed on side surfaces of the intermediate layer to encapsulate the intermediate layer with the first and second layers.

8. The device of claim 1, wherein a second layer is formed on a top surface of both a first layer and the intermediate layer and on side surfaces of both the first and intermediate layers such that the intermediate layer is encapsulated by the first and second layers.

9. The device of claim 1, wherein first layer and the intermediate layer are formed to have the same width as each other, and the second layer formed is formed on a top surface of the intermediate layer and on side surfaces of both the first and intermediate layers such that the intermediate layer is encapsulated by the first and second wiring layers.

10. The device of claim 1, wherein a first layer formed on a lower part of the intermediate layer and a second layer formed on an upper part of the intermediate layer are formed of different materials from each other.

11. The device of claim 1, further comprising:
a first electrode and a second electrode, wherein the organic emitting layer is disposed between the first and second electrodes.

12. The device of claim 1, wherein the switching unit comprises one or two thin film transistors.

13. The device of claim 1, wherein the driving unit comprises one or two thin film transistors.

14. The device of claim 12 or 13, wherein a thin film transistor comprises:
an active layer formed to have source and drain areas at both sides of the active layer that are doped with impurities at a high density and has a channel area in a center portion thereof;
a gate electrode disposed on a gate insulating layer above the channel area of the active layer;
an interlayer insulator formed on the gate electrode; and
source and drain electrodes electrically connecting to the source and drain, wherein the gate electrode has a three-layer structure in which an intermediate layer is made of copper.

15. An organic electro luminescence device comprising:
a gate line for supplying a gate signal;
a data line for supplying image information that crosses the gate line;
a pixel area adjacent to where the gate line and the data line cross each other;
an organic emitting layer formed in the pixel area;
a switching unit for switching image information supplied from the data line in response to the gate signal supplied from the gate line;
a driving unit for applying electric field across the organic emitting layer according to the image information applied through the switching unit; and
a power line, which is a first three-layer structure including an intermediate layer made of copper that is surrounded by the other two layers, for providing the driving unit with source voltage.

16. The device of claim 15, wherein the data line is a second three-layer structure including copper as an intermediate layer.

17. The device of claim 16, wherein the gate line is a third three-layer structure including copper as an intermediate layer.

18. The device of claim 15, wherein the gate line is a second three-layer structure including copper as an intermediate layer.

19. The device of claim 15, wherein the driving unit includes a thin film transistor comprising:
an active layer formed to have source and drain areas at both sides of the active layer that are doped with impurities at a high density and has a channel area in a center portion thereof;
a gate electrode disposed on a gate insulating layer above the channel area of the active layer;
an interlayer insulator formed on the gate electrode; and
source and drain electrodes electrically connecting to the source and drain, wherein the gate electrode has a second three-layer structure in which an intermediate layer is made of copper.

20. The device of claim 15 or 16, wherein a second layer formed on a top surface and side surfaces of an intermediate layer and a first layer formed on lower surface of an intermediate layer connects to the second layer formed on side surfaces of the intermediate layer to encapsulate the intermediate layer with the first and second layers.

21. The device of claim 15 or 16, wherein a second layer is formed on a top surface of both a first layer and an intermediate layer and on side surfaces of both the first and intermediate layers such that the intermediate layer is encapsulated by the first and second layers.

22. The device of claim 15 or 16, wherein a first layer and an intermediate layer are formed to have the same width as each other, and the second layer formed is formed on a top surface of the intermediate layer and on side surfaces of both the first and intermediate layers such that the intermediate layer is encapsulated by the first and second layers.

23. The device of claim 15, wherein a first layer formed on a lower part of the intermediate layer and a second layer formed on an upper part of the intermediate layer are formed of different materials from each other.

* * * * *